United States Patent [19]

Currie

[11] Patent Number: 5,290,970
[45] Date of Patent: Mar. 1, 1994

[54] MULTILAYER PRINTED CIRCUIT BOARD REWORK METHOD AND REWORK PIN

[75] Inventor: Thomas P. Currie, St. Paul, Minn.

[73] Assignee: Unisys Corporation, Blue Bell, Pa.

[21] Appl. No.: 947,227

[22] Filed: Sep. 18, 1992

[51] Int. Cl.$^5$ .............................................. H05M 1/00
[52] U.S. Cl. ................................... 174/250; 174/265; 174/266; 439/46; 439/75; 361/785
[58] Field of Search ............... 174/262, 264, 266, 267, 174/250, 265; 361/412, 413, 414, 410, 352; 439/45, 46, 75; 29/847

[56] References Cited

U.S. PATENT DOCUMENTS 3,212,048 10/1965 Rosenberg et al. .
5,038,252 8/1991 Johnson .
5,050,295 9/1991 Sullivan et al. .

*Primary Examiner*—Leo P. Picard
*Assistant Examiner*—Cheryl R. Figlin
*Attorney, Agent, or Firm*—Charles A. Johnson

[57] ABSTRACT

An improved rework method and rework pin for repairing and reworking multilayer printed circuit boards are described. The rework pin is constructed of conductive material having a configuration that accommodates the configuration of through holes in a multilayer printed circuit board assembly. The rework pin includes a cup-like structure at one end for cooperating with component leads, an elongated electrically insulated portion and an electrically conductive tip portion extending beyond the thickness of the multilayer board.

1 Claim, 3 Drawing Sheets

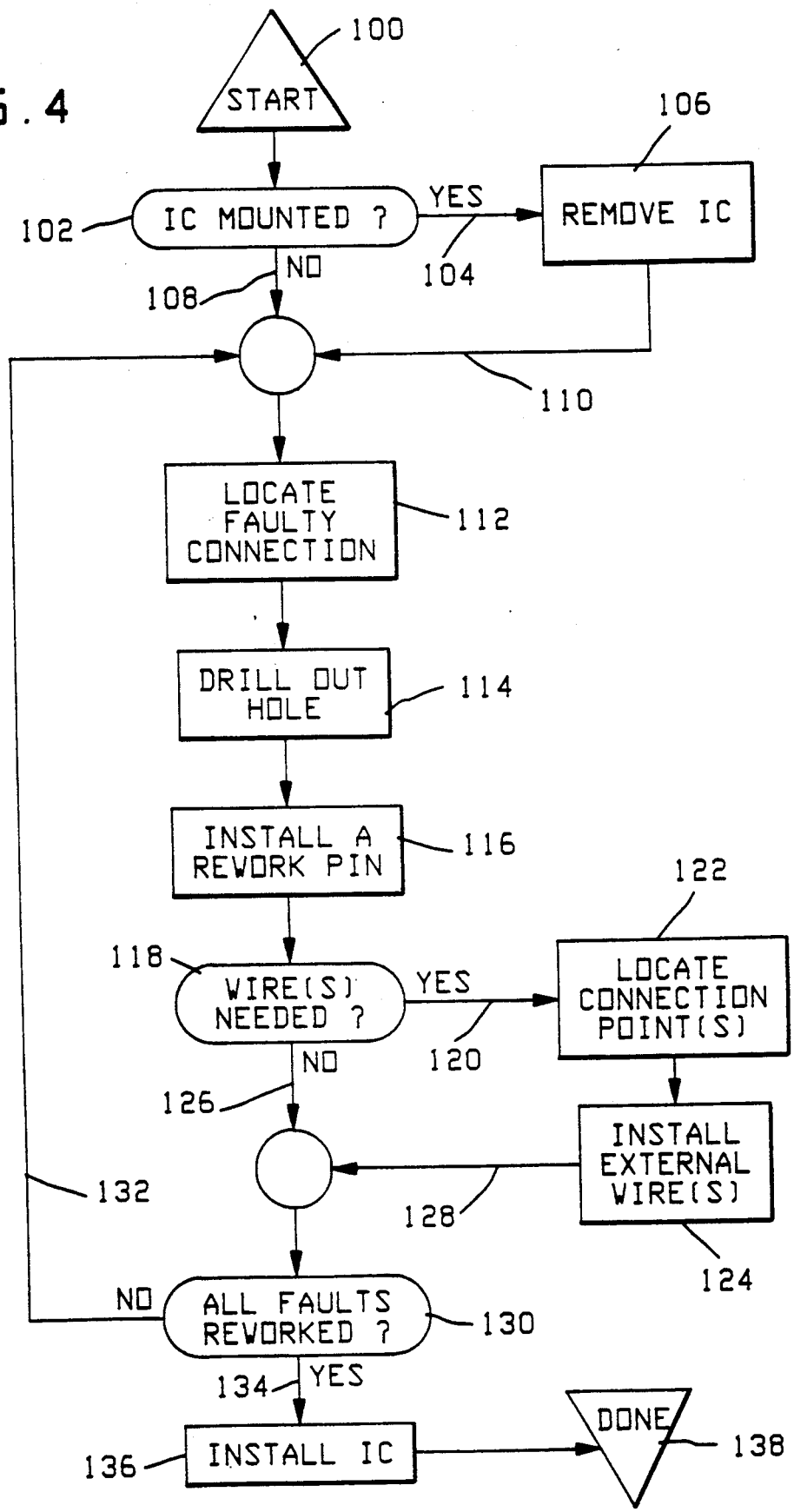

MULTILAYER PRINTED CIRCUIT BOARD REWORK METHOD AND REWORK PIN

BACKGROUND OF THE INVENTION

1. Field of the Invention

The invention relates to an improved method and apparatus for repairing or reworking complex multilayer printed circuit board interconnections.

2. Description of the Prior Art

It is known to utilize printed circuit boards to make electrical interconnections between leads of electrical components mounted thereon. Printed circuit boards characteristically involve one or more discrete layers of insulating material upon which patterns of electrical conductors are formed in conjunction with a predetermined array of holes. The electrical conductors are referred to as foil. The layers are stacked, bonded, and the hole patterns formed and plated-through with electrical conductive materials. Characteristically, plated-through holes are uniform in diameter, and are often referred to as "barrels". Selective interconnections result in selected wiring networks, or nets, being formed with various ones of the electrical conductors on different layers being interconnected through the plated-through holes. At the mounting surfaces, it is known to provide additional electrically conductive material in electrical contact with the plated-through holes for the purposes of providing an expanded pad area for making interconnection with the component contacts, terminals, or leads.

It has been the usual practice to have the diameter of the plated-through holes uniform throughout the thickness of the multilayer printed circuit board. With the advent-of continued reduction in size of the electronic components, the spacing of the component connections, and the associated array of holes, has been ever-reducing. At the same time, the complexity of the interconnections that are to be made by the multilayer printed circuit boards has increased. This increase in the number of interconnections results in the requirement of providing more conductive routing paths on the various layers, where these routing paths must be constructed in ever-decreasing dimensions. The loss of routing area resulting from the reduction in pin spacing in the grid array of plated-through holes has lead to the requirement of adding additional layers to the multilayer printed circuit board assemblies, with the attendant increase in cost of manufacture.

The increase in the number of layers leads to additional problems of registration of the layers. Registration is positioning and placement of the grid array of holes of the layers with respect to the other layers in the assembly. Poor registration can result in reduced reliability of the formation of the electrical interconnections to the respective plated-through holes in the grid array. Reduction of the hole diameters will result in more area per layer for routing paths. Greatly increasing the number of layers and the number of plated-through holes on a printed circuit board assembly renders each such printed circuit board that is successfully constructed and tested, a valuable commodity.

It is known to utilize so-called surface mount components, where relatively short component leads are affixed to surface pads on the multilayer printed circuit boards. Characteristically, they are affixed through a solder process. It is also known to provide long-lead interconnection of components to the multilayer printed circuit board, wherein the component leads are formed and inserted in respectively associated ones of the plated-through holes. After such insertion, the leads are soldered in place. Both forms of interconnect have problems attendant to the manufacturing processes. The surface mount has the problem of location of all of the terminals of a component over the associated interconnection pads during the soldering process. Any misalignment or misplacement can result in missing or marginal solder interconnections. The insertion of the long-lead electrical components can result in bent leads not properly being inserted through the depth of the plated-through holes, thereby either slowing the manufacturing process if detected, or resulting in a defective assembly if not detected at the time of component insertion.

It is also well-known in the design of the electrical interconnections to be made on the printed circuit board assembly, that design problems can result in wiring network layouts that must be altered or reworked to form correct wiring network interconnections. Further, it is known that in the fabrication of multilayer printed circuit boards it can occur, for various manufacturing reasons, that one or more layers may have electrical conductors improperly electrically shorted to a plated-through hole. Unless such a shorted condition can be repaired, the entire assembly has to be scrapped. Various types of rework and repair techniques have been developed, but such known repair and rework techniques are complex; and if not accomplished with skill and precision, can result in further damage to the printed circuit board and failure to remedy the problem. As the printed circuit boards become larger there is an increase in the number of plated-through holes of smaller diameter, and more layers, are utilized, it becomes more and more necessary to have an effective and efficient way to rework incorrect or defect wiring nets to save the boards.

In prior art multilayer boards it was common to have component leads extend through the thickness of the board and to be soldered within the plated-through holes. Structures that received component leads were generally of a larger diameter and the printed circuit boards were of a thickness that allowed the leads to pass through the board. To rework this type of board, it was common to drill out the hole and insert an insulating sleeve or fill it with nonconductive material such as epoxy. The fill material was drilled to receive a component lead. Clearly the drilled hole size or the sleeve opening would require sufficient size to accept the component pin after the repair process. As board hole sizes decreased and board thickness increased, this rework process becomes difficult, if not impossible. This prior art rework process had the further disadvantage that the component leads often were trimmed to the thickness of the printed circuit board. Obviously this did not provide any terminal length to which a rework wire could be coupled on the solder side of the board. To alleviate this deficiency, it was necessary to attach conductive lead extenders so that the external rework wires could be attached. These rework processes cannot be efficiently and reliably accomplished on thick printed circuit boards having high-aspect ratio plated-through holes.

OBJECTS

It is the primary objective of this invention to provide a method and apparatus to efficiently repair and rework multilayer printed circuit boards.

It is a further primary objective of this invention to provide an improved printed circuit board assembly having an improved structure for use in affixing electrical components that may be reworked as necessary to correct design and manufacturing deficiencies.

Yet another object of the invention is to provide an improved printed circuit board assembly having a structure for affixing electrical components that is suitable for either surface mount or lead insertion of such components, wherein defective connections can be reworked and the electrical components re-affixed.

Another object of the invention is to provide an improved multilayer printed circuit board assembly having an array of plated-through holes having cup-like structure at the component mounting end in cooperation with a smaller diameter barrel passing through the remainder of the assembly, and a rework pin structure that can be utilized to rework circuit interconnections when inserted in selected ones of the plated-through holes.

Yet another object of the invention is to provide an improved multilayer printed circuit board assembly having plated-through holes having relatively long barrels of small diameter to allow additional printed circuit wiring paths on layers of the assembly, and relatively larger diameter portions for providing cup-like retention of associated electrical component leads and solder for affixing the leads, and rework pins that match the plated-through hole configuration.

A further object of the invention is to provide an improved multilayer printed circuit board assembly with enhanced capability of rework or repair to allow repair of defects in manufacture and rework of erroneous interconnections of electrical wiring networks with improved rework pins.

Still a further object of the invention is to provide an improved repair and rework pin structure for use with the improved multilayer printed circuit board assembly for effectively and reliably allowing the repair and rework of the assembly.

Yet another object of the invention is to provide an improved rework pin structure that matches the shape of plated-through holes and has an insulating material deposited on a portion thereof.

A further object of the invention is to provide an improved rework apparatus and method to efficiently and economically rework multilayered printed circuit boards to avoid necessity to scrap defective or damaged boards.

Other more detailed objectives will become apparent from a consideration of the Drawings and the Detailed Description of the Preferred Embodiment.

SUMMARY OF THE INVENTION

To overcome the problems in the prior art, an improved high performance multilayer printed circuit board assembly has been developed, wherein plated-through holes, arranged in a grid array are structured having a first diameter to a relatively shallow depth in the printed circuit board assembly, and a second relatively smaller diameter throughout the balance of the depth of the printed circuit board. The first and second diameter holes thereby form a cup-like structure for receiving relatively short electronic component terminals either in a surface mount or inserted manner. The relatively smaller diameter of the major lengths of the plated-through holes provides additional routing space for printed circuit lines on those layers where the smaller diameter exists.

To effect the repair and rework of the improved board assembly, an improved rework pin is provided. The improved rework pin is constructed of conductive material and having a configuration that accommodates the configuration of the plated-through holes utilizing a cup-like Structure at one end of the pin. A suitable electrically insulating material is coated on the surface of the rework pin, with exception of a relatively short tip that is designed to just protrude beyond the back of the printed circuit board. The unprotected electrically conductive tip is available for connection to a corrective wire. By drilling out defective plated-through holes or drilling out incorrect net connections, the improved insulated rework pin can be inserted through this multilayer printed circuit board and electrical connection made from a component lead at one surface to an external wire at the other end. The external wire can then be utilized to effect repair or rework interconnection to another circuit joint.

BRIEF DESCRIPTION OF THE DRAWINGS

FIG. 4 is a process flow diagram illustrating the repair and rework process.

DETAILED DESCRIPTION OF THE PREFERRED EMBODIMENT

Figure 1:
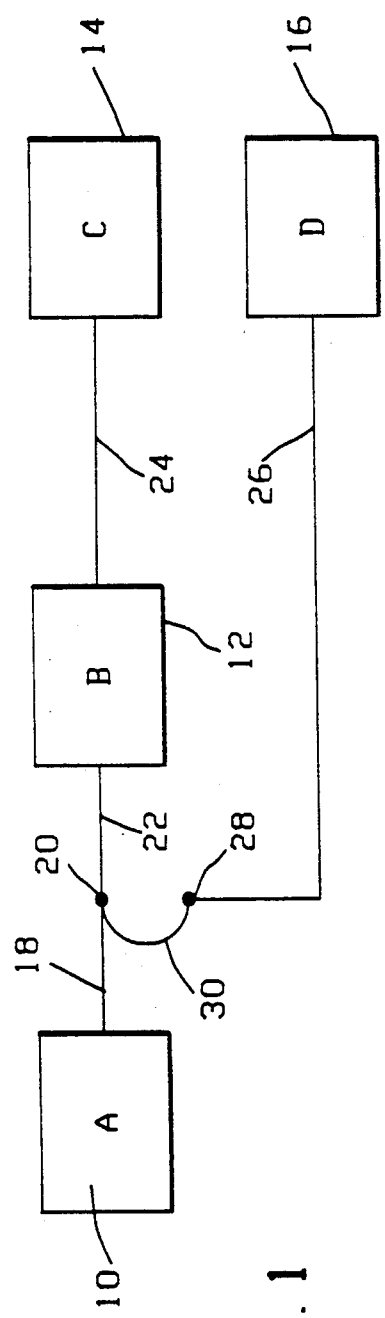
FIG. 1 is a schematic diagram of a wiring net that has an incorrect connection that is to be reworked.

FIG. 1 is a schematic diagram of a wiring net that has an incorrect connection that is to be reworked. In this arrangement there is schematically shown component A labelled 10, component B labelled 12, component C labelled 14, and component D labelled 16. In this configuration line 18 represents a conductor coupled to a plated-through hole connection 20, which in turn is coupled to conductor 22 on component 12. The component B is coupled to component C via conductor 24. Component D is coupled via conductor 26 to plated-through hole 28. This arrangement illustrates a rework that requires the disconnection of conductor 22 from plated-through hole 20 as an incorrect or faulty connection. To accomplish the rework, plated-through hole 20 is physically disconnected from the conductor 22, as by drilling the hole out,, and a rework pin (to be described in more detail below) is inserted in drilled out plated-through hole 20, and coupled via rework wire 30 to the correct net position 28. As will be described in more detail below, each of the conductors 18, 22, 24, and 26 are electrical conductors (foils) laid out on a multilayer printed circuit board.

Figure 2:
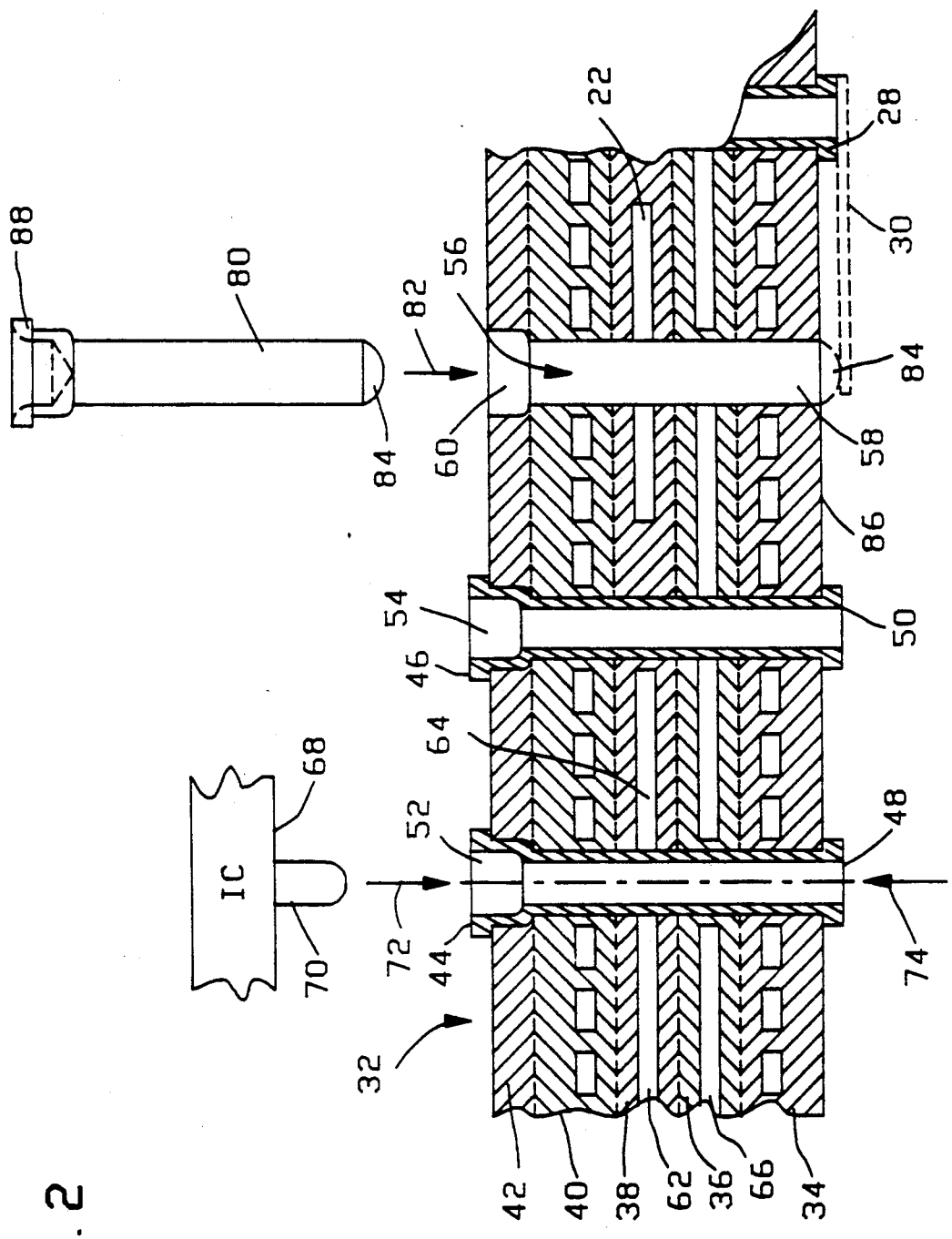
FIG. 2 is a cutaway view of a portion of a multilayer printed circuit board illustrating the plated-through hole configuration and the rework pin for correcting a defect in the board.

FIG. 2 is a cutaway view of a portion of a multilayer printed circuit board illustrating the plated-through hole configuration and the rework pin for correcting a defect in the board. The multilayer printed circuit board structure generally indicated at 32 is constructed of multiple layers. For purposes of illustration, board layers 34, 36, 38, 40 and 42 are shown. In practice, the complex multilayer printed circuit boards of this invention may have 50 layers or more. The preferred embodiment has a surface dimension of 22½ inches by 23 inches, and has in excess of 80,000 circuit component connection points arranged in a predetermined array of plated-through holes. As is known, the multilayer printed circuit boards achieve essentially a three dimensional routing capability with connections routed on each of the layers, and interconnected through connections to plated-through holes.

In general, the multilayer printed circuit boards 32 are constructed of layers of dielectric having conductive circuit paths formed thereon. The individual layers are positioned with preimpregnated thermal setting resin mats, and upon being subjected to heat and pressure the layers and pre-preg are laminated into a unitary structure. After lamination the multilayer board is drilled in a predetermined grid array, and the resulting via holes are copper plated.

In FIG. 2 there are two plated-through hole structures 44 and 46 that illustrate the elongated portion 48 and 50, each with a pin receiving cup structure at the top 52 and 54, respectively. Prior to the plating process the holes, such as hole 56 are drilled nominally at its lower portion 58 to a diameter of 0.022 inch, and at the cup structure 60 is drilled to a nominal diameter of about 0.030 inch. Hole structures of this type are generally referred to as "high aspect" holes, thereby indicating that the diameter of the hole is substantially smaller than the length of the hole. It can be seen that this relationship is true where a fifty layer board of this construction would have a nominal thickness 0.325 inch.

By way of example, the printed circuit conductors running perpendicular to the hole structures may be coupled to the various plated-through holes. For example, conductor 62 is coupled to one wall of plated-through hole 44 as is conductor 64. It can be seen that conductor 66 falls short of plated-through hole 44 and should not be connected thereto. If it should occur that a defect in the manufacturing process resulted in conductor 66 extending farther than intended to the extent that electrical interconnection is made with the wall of plated-through 44, it can be seen that this would result in erroneous circuit wiring connection and would cause malfunction. It is this type of erroneous connection that requires rework to salvage the expensive printed circuit board structure.

To make an operable assembly, integrated circuits such as IC 68 have pins, such as pin 70, that are arranged to cooperate with the solder-cups such as cup 52 in the printed circuit board. When IC 68 has pin 70 inserted in the direction of arrow 72 into cup 52, it is in position where solder can be applied in the direction of arrow 74 up through the plated-through hole portion 48 and into cup 52 to thereby make a solder connection to terminal 70.

If it is assumed that hole 56 is analogous to position 20 in FIG. 1 and that conductor 22 is the erroneous connection to the pin, it can be seen that the plated-through hole must be drilled out to disconnect the connection to conductor 22. To accomplish disconnect, hole 56 is drilled out to a nominal diameter 0.027 inch, thereby assuring removal of all of the conductive material of the plated-through hole. In a similar manner the cup structure 60 is drilled out completely. To effect the rework, an electrically conductive rework pin 80, as will be described in more detail below, is inserted in the direction of arrow 82 completely through the printed circuit board assembly 32 by passing it through the drilled out hole 56. When inserted, tip portion 84 extends beyond the bottom 86 of the multilayer printed circuit board. Once inserted, a wire 30 can be attached to the tip 84 and to the correction terminal such as 28 from FIG. 1. It can be Been, then, that the top 88 of pin 80 is equivalent to plated-through hole 20 in FIG. 1, and that the insulating material on rework pin 80 insulates the circuit connection from the erroneous wire connection 22. In this manner the wiring net that was erroneously connected may be reworked and the entire expensive multilayer printed circuit board can be fully utilized.

Figure 3:
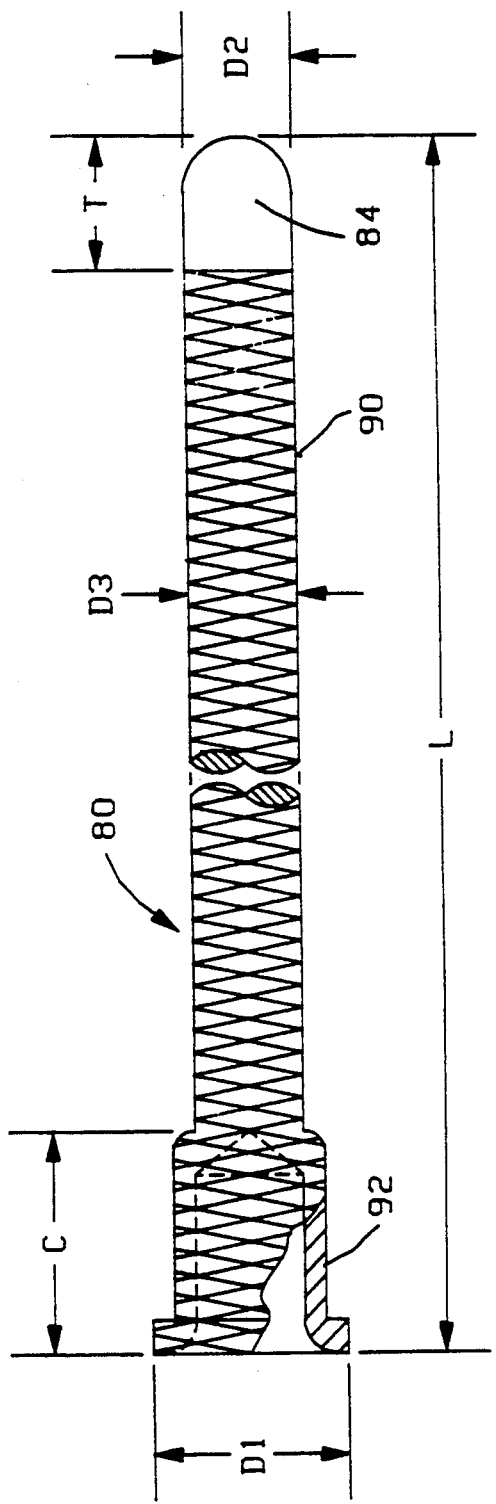
FIG. 3 is a view of the improved rework pin of this invention.

FIG. 3 is a view of the improved rework pin of this invention. In this arrangement the rework pin designated generally as 80, has an elongated portion 90 that is covered with electrically insulating material and a tip 84 that is not electrically insulated. At one end of the elongated portion 90 there is a cup structure 92, the inside of which is not electrically insulated. In the preferred embodiment rework pin 80 has a round cross section through its elongated portion 90 with a round cup structure 92 at one end thereof, and is formed from beryllium copper. Pin 80 has a length L to the base of the tip of the cup structure 92 of 0.355 inch. The depth C of cup structure 92 is 0.05 inch and the length T of tip 84 is 0.03 inch nominally. The diameter D1 of cup structure 92 is nominally 0.046 inch, and the uncoated diameter D2 of the elongated portion 90 and tip portion 84 is 0.023 inch. Rework pin 80 is coated uniformly with an electrically insulating material. In the preferred embodiment a coating of a commercially available substantially pin-hole free plastic material having a thickness of approximately 0.0006 inch is utilized. This insulating coating yields a diameter D3 after coating of about 0.024 inch. It should be understood that the dimensions given are all nominal and are all subject to appropriate tolerances in actual construction. It can be seen that the dimensions of the finished rework pin are such that when the printed circuit board 32 is drilled out that the drilled out opening, such as opening 56 in FIG. 2, is of a dimension to slidably receive the rework pin.

From the foregoing, it can be seen that the rework pin 80 can be utilized to eliminate shorts within the structure of the printed circuit board 32, and allows integrated circuit packages to be reconnected in a different pattern to accomplish logic changes, without problems of reinsertion of long leads, or the requirement to attach lead extenders. The foreshortened package pin such as pin 70 need not be extended for the external rework in that the rework pin 80 is of sufficient length to extend through the thickness of printed circuit assembly 32. The insulating coating on rework pin 80 insulates the conductive pin from the old net connections within the layers of the multilayer printed circuit board, and after rework allows the printed circuit board 32 to be used.

Rework pin 80 accomplishes three major functions in that it extends the integrated circuit package pin so that it is accessible on the solder side of the multilayer printed circuit board; it insulates the integrated circuit package pin from the conductors that impinge on the hole; and it restores the solder-cup structure so that the standard solder process can be utilized to reinstall the integrated circuit package.

FIG. 4 is a process flow diagram illustrating the repair and rework process. At the Start 100 of the rework process, it is first determined whether an IC is mounted on the multilayer printed circuit board, as indicated by decision element 102. If an IC is present, the Yes path 104 is taken and the process to Remove the IC 106 is accomplished. Removal is accomplished by locally applying heat to melt the solder in the associated solder-cups. If no IC is present, as indicated by No path 108, or after the IC is removed as indicated by path 110, it is then necessary to Locate Faulty Connection 112. The faulty connection in the plated-through holes formed the pin grid array is identified as the source of the faulty operation either through an improper design or an improper manufacturing function. Once the faulty location is identified, the faulty plated-through hole is drilled out, as indicated by Drill out Hole operation 114. Once the drilling is accomplished as described, the next rework step is to Install a Rework Pin 116. Once the rework pin is installed, it is necessary to determine whether or not an external wire is needed, as indicated by the Wire(s) Needed? decision element 118. If it is determined that one or more external wires as needed to correct the wiring net, the Yes path 120 is taken and the process is to Locate Connection Point(s) 122. Once the connection points are located, the next step in the rework process is to Install External Wire(s) 124. If no wires are needed, as indicated by the No path 126, or if the wires are installed as indicated by process path 128, it is then necessary to determine if All Faults Reworked, as indicated by decision 130. If there are more faults to rework, the No path 132 is taken, and the rework process returns to locate the next faulty connection to be reworked. When all faults have been reworked, the Yes path 134 is taken and the previously removed IC can be reinstalled as indicated by Install IC step 136. At that time the rework process is Done 138.

From the foregoing it can be seen that the various objectives and purposes have been achieved. The use of the through-hold conforming electrically insulated rework pins with external correction wires results in an improved rework multilayer printed circuit board structure. The rework process and apparatus is extremely cost-effective in that rework can save extremely expensive board structures from being scrapped.

The invention has been described in its presently contemplated best mode, and it is clear that it is susceptible to various modifications, modes of operation and embodiments, all within the ability and skill of those Skilled in the art and without the exercise of further inventive activity. Accordingly, what is intended to be protected by Letters Patents is set forth the appended claims.

I claim:

1. A method for reworking multilayer printed circuit board assemblies having component leads electrically connected to associated solder-cups on one surface of the printed circuit board assembly, where the solder-cups are integrately formed with plated-through holes extending through the thickness of the multilayer printed circuit board, said rework method comprising the steps of:

A. locating a plated-through hole that requires rework;

B. drilling out the plating in the located plated-through hole and associated solder-cup;

C. providing, a rework pin having an elongated body with a solder-cup portion at one end thereof and an electrically conductive tip extending beyond the backside of the printed circuit board at the other end thereof;

D. installing said rework pin in the drilled out through hole;

E. selecting a rework wire connection from the rework pin to another plated-through hole;

F. locating the required rework wire connection point on the back of the printed circuit board;

G. electrically installing the rework wire from said tip of said rework pin to the selected connection point; and H. repeating steps A through G unit rework is completed.

* * * * *